United States Patent
Kim

(10) Patent No.: US 7,912,882 B2
(45) Date of Patent: Mar. 22, 2011

(54) APPARATUS FOR GENERATING CLOCK PULSES USING A DIRECT DIGITAL SYNTHESIZER

(75) Inventor: In Gon Kim, Yongin-si (KR)

(73) Assignee: Transpacific Sonic, LLC, Wilmington, DE (US)

( * ) Notice: Subject to any disclaimer, the term of this patent is extended or adjusted under 35 U.S.C. 154(b) by 1001 days.

(21) Appl. No.: 10/561,558

(22) PCT Filed: Jul. 26, 2004

(86) PCT No.: PCT/KR2004/001878
§ 371 (c)(1),
(2), (4) Date: Sep. 5, 2006

(87) PCT Pub. No.: WO2005/011102
PCT Pub. Date: Feb. 3, 2005

(65) Prior Publication Data
US 2007/0164793 A1 Jul. 19, 2007

(30) Foreign Application Priority Data
Jul. 25, 2003 (KR) .................. 10-2003-0051480

(51) Int. Cl.
*G06F 1/08* (2006.01)
(52) U.S. Cl. ........................................ 708/271
(58) Field of Classification Search .................. None
See application file for complete search history.

(56) References Cited

U.S. PATENT DOCUMENTS

| | | | |
|---|---|---|---|
| 5,528,308 A | | 6/1996 | Alelyunas et al. |
| 5,898,325 A | * | 4/1999 | Crook et al. ............... 327/105 |
| 5,977,804 A | * | 11/1999 | Beech ........................ 327/107 |
| 6,483,388 B2 | * | 11/2002 | Khan .......................... 331/18 |
| 7,092,476 B1 | * | 8/2006 | Melanson .................. 375/376 |

(Continued)

FOREIGN PATENT DOCUMENTS

JP 6-252645 9/1994

(Continued)

OTHER PUBLICATIONS

International Preliminary Report on Patentability for corresponding International Application No. PCT/KR2004/001878, dated Jan. 30, 2006.

(Continued)

*Primary Examiner* — David H Malzahn
(74) *Attorney, Agent, or Firm* — McDonnell Boehnen Hulbert & Berghoff LLP

(57) ABSTRACT

The present invention relates to an apparatus for generating clock pulses using a Direct Digital Synthesizer (DDS). The present invention seeks to solve the problems of the conventional clock generator using a Phase Locked Loop (PLL) circuit where the output clock frequency cannot be varied and the output clock signal is degraded because of jitter and phase noise. The claimed apparatus comprises a phase accumulator, a phase-to-magnitude converter, a Digital-to-Analog (DA) converter, a band pass filter, and a comparator, which are serially connected. A 10×PLL multiplier provides a 196.608 MHz clock signal to the phase accumulator, the phase-magnitude converter and the digital analog converter, respectively. The phase accumulator also receives a Frequency Tuning Word (FTW) and using this FTW and the 196.608 MHz clock, outputs a desired specific frequency value. This frequency value is processed through the phase-magnitude converter, the digital analog converter, a band pass filter and a comparator in order to become a square wave of a desired frequency with a low jitter.

20 Claims, 2 Drawing Sheets

U.S. PATENT DOCUMENTS

| | | | | |
|---|---|---|---|---|
| 7,124,153 B2 * | 10/2006 | Grushin | | 708/103 |
| 7,242,225 B2 * | 7/2007 | Klage | | 327/106 |
| 7,577,695 B2 * | 8/2009 | Dai | | 708/271 |
| 7,599,977 B2 * | 10/2009 | Ammar | | 708/271 |
| 2002/0008588 A1 * | 1/2002 | Khan | | 331/18 |

FOREIGN PATENT DOCUMENTS

| | | |
|---|---|---|
| JP | 10-031529 | 2/1998 |

OTHER PUBLICATIONS

Official Notice of Preliminary Rejection for corresponding Korean Application No. 10-2003-0051480, dated Mar. 5, 2010 (with English-language translation).

Notice of Allowance for corresponding Korean Application No. 10-2003-0051480, dated May 14, 2010 (with English-language translation of allowed claims).

* cited by examiner

APPARATUS FOR GENERATING CLOCK PULSES USING A DIRECT DIGITAL SYNTHESIZER

TECHNICAL FIELD

The present invention generally relates to an apparatus for generating clock pulses using a Direct Digital Synthesizer (DDS), and more particularly to an apparatus which produces a particular desired frequency by changing a Frequency Tuning Word (FTW) when generating the clock pulses using the DDS.

BACKGROUND ART

As is well known, in a CDMA2000 1X base station transmit system, a Digital Up-converter Card Assembly (DUCA) is used to generate 58.9824 MHz clock pulses. These pulses are used to perform all signal processing based on 19.6608 MHz reference clock pulses.

As is shown in FIG. 1, a conventional clock generator using a Phase Locked Loop (PLL) is configured to generate 58.9824 MHz clock pulses in which their phase is locked with a 19.6608 MHz by PLL 10. PLL 10 comprises a phase detector 11, a low pass filter 12, and a Voltage Controlled Oscillator (VCO) 13.

However, when the clock pulses are generated using a conventional clock generator with PLL 10 such as the one described above, the output clock frequency cannot vary in accordance with system performance. This is because the output clock frequency is fixed. Further, the quality of the output clock signal may become degraded due to jitter and phase noise.

DISCLOSURE OF INVENTION

Technical Problem

As described above, the conventional clock generator using a PLL circuit is disadvantageous since the output clock frequency cannot be varied while the output clock signal may become degraded due to jitter and phase noise.

Technical Solution

It is, therefore, an object of the present invention to provide an apparatus for generating clock pulses using a DDS having high frequency resolution. It should be noted that the frequency of the generated clock pulses is easily changeable and their signals are free from jitter and phase noise.

In accordance with the present invention, there is provided an apparatus for generating clock pulses using a DDS. Such apparatus comprises: (1) a DDS, which comprises a PLL multiplier for receiving system reference clock pulses of a first frequency, configured to convert the system reference clock pulses into a DDS operation clock signals of a second frequency; a phase accumulator for receiving a Frequency Tuning Word (FTW), accumulating a phase by the FTW, and outputting the phase of a particular desired frequency, wherein the phase accumulator operates using the DDS operation clock signals from the PLL multiplier; a phase-to-magnitude for, in responsive to the accumulated phase of the particular frequency from the phase accumulator, providing a clock signal having a magnitude corresponding to the phase of the particular frequency, wherein the phase-to-magnitude operates using the DDS operation clock signals from the PLL multiplier; a Digital-to-Analog (DA) converter for, in responsive to the clock signal from the phase-magnitude converter, converting the clock signal to an analog signal of a DDS output frequency, wherein the DA converter operates using the DDS operation clock signals from the PLL multiplier; (2) a band pass filter for bandpass-filtering the analog signal of the DDS output frequency from the DA converter to provide a bandpass-filtered signal; and (3) a comparator for, in responsive to the bandpass-filtered signal from the band pass filter, transforming the signal of the DDS output frequency into a square wave.

ADVANTAGEOUS EFFECTS

According to the present invention, a particular desired frequency may be produced by changing the FTW when generating the clock pulses using the DDS. This is so that the output frequency can be changed more flexibly than the conventional clock generator using a PLL. Further, better stable system clock pulses can be supplied by removing the jitter, phase noise, etc.

BRIEF DESCRIPTION OF THE DRAWINGS

The above and other objects and features in accordance with the present invention will become more apparent from the following description of a preferred embodiment given in conjunction with the accompanying drawings, in which.

BEST MODE FOR CARRYING OUT THE INVENTION

In the disclosure below, an embodiment of the present invention will be described in detail with reference to the accompanying drawing.

Figure 1:
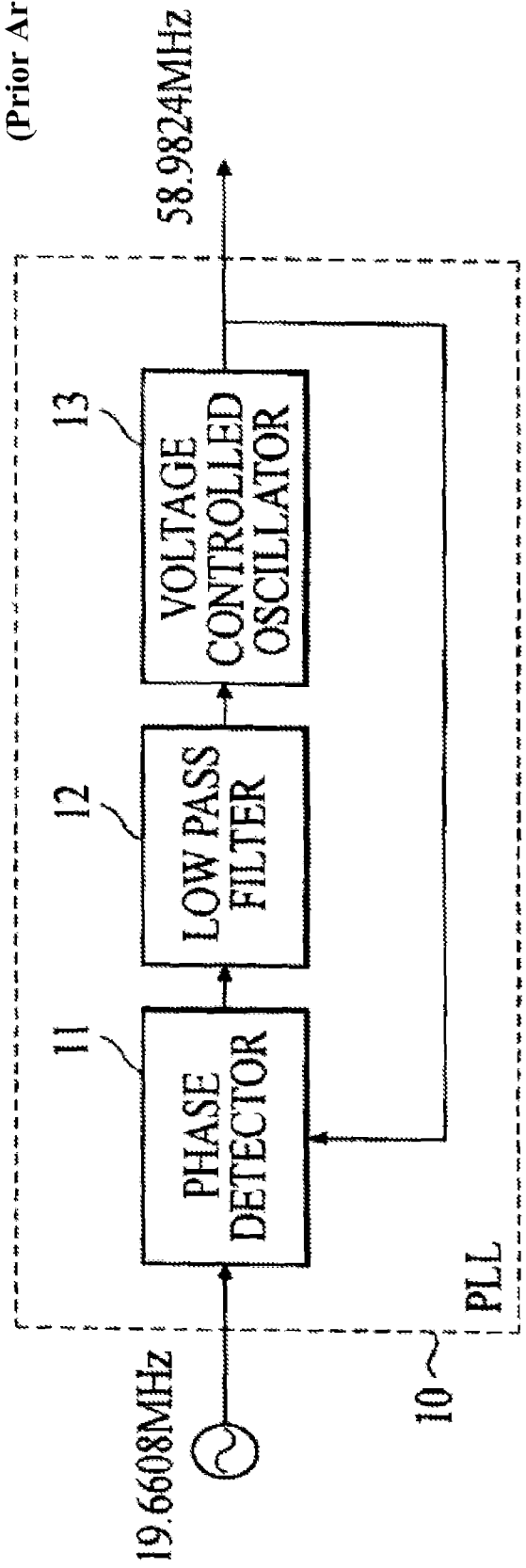
FIG. 1 is a functional block diagram of a conventional clock generator using a PLL.
Figure 2:
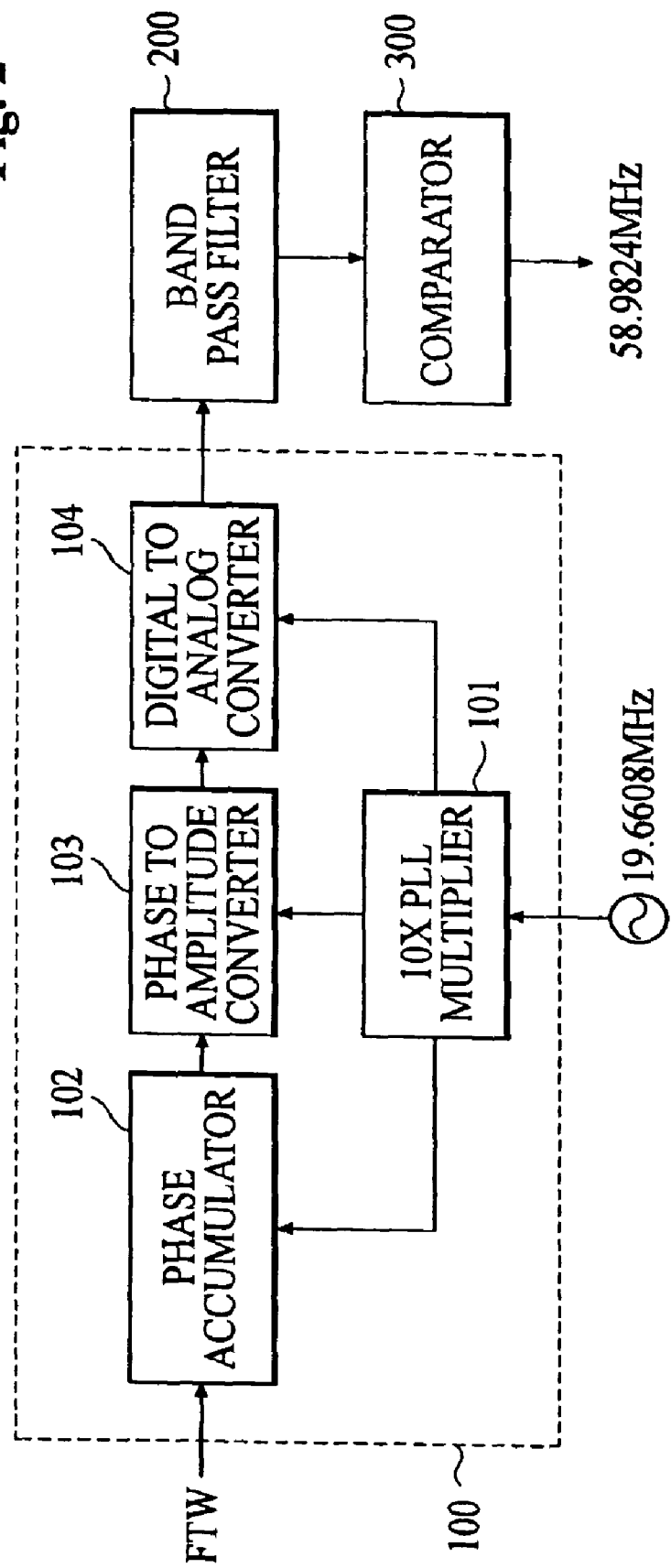
FIG. 2 is a functional block diagram of an apparatus for generating clock pulses using a DDS according to one embodiment of the present invention.

FIG. 2 is a functional block diagram of an apparatus for generating clock pulses using a DDS 100 according to one embodiment of the present invention. Referring to FIG. 2, the apparatus comprises a DDS 100 including the following elements: a 10×PLL multiplier 101; a phase accumulator 102; a phase-to-magnitude converter 103; a Digital-to-Analog (DA) converter 104; a band pass filter 200; and a comparator 300.

10×PLL multiplier 101 within the DDS 100 receives 19.6608 MHz system reference clock pulses, converts the system reference clock pulses into 196.608 MHz DDS operation clock signals and provides the DDS operation clock signals to phase accumulator 102, phase-to-magnitude converter 103 and DA converter 104, respectively.

Phase accumulator 102 within the DDS 100, which operates using the DDS operation clock signals from 10×PLL multiplier 101, receives a FTW in a binary format and accumulates a phase by the FTW to output the phase of a particular desired frequency to phase-to-magnitude converter 103.

Phase-to-magnitude converter 103 within DDS 100, which operates using the DDS operation clock signals from the 10×PLL multiplier 101, receives the accumulated phase of the particular frequency from the phase accumulator 102, converts the phase value into a corresponding magnitude of a sinusoidal wave of the particular frequency, and outputs the sinusoidal signal to DA converter 104.

DA converter 104 within DDS 100, which operates using the DDS operation clock signals from the 10×PLL multiplier 101, receives the sinusoidal signal from the phase-magnitude converter 103, converts the signal to an analog signal and output the analog signal of a DDS output frequency to band pass filter 200.

The DDS output frequency can be derived from equation (1) below. The FTW, which is used to change the output frequency, can be derived from equation (2) below.

$$f_{out} = (W * f_{clk})/2^N \quad (1)$$

where $f_{out}$ is an output frequency, W is a binary value for the FTW, $f_{clk}$ is an operation clock frequency, and N is the number of input bits of phase accumulator 102.

$$W = INT[(f_{out}/f_{clk}) * 2^N] \quad (2)$$

where INT[ ] denotes an integer part of the bracketed expression.

Band pass filter 200 receives the analog signal of the DDS output frequency from the DA converter 104. It then passes and outputs the signal only over a desired band of the DDS output frequency to comparator 300. In this case, band pass filter 200 may produce a clean sinusoidal waveform by removing unnecessary spurious signals, harmonics signals, etc. Further, a low pass filter may be used to pass only the frequencies lower than a particular frequency.

Comparator 300 receives the signal over the desired band of the DDS output frequency from band pass filter 200, transforms the signal of the DDS output frequency into a square wave with a low jitter, and outputs the square wave. Furthermore, comparator 300 has a precise zero-crossing threshold, and thus may output the square wave free from jitter and phase noise.

There is provided a description of a procedure for generating clock pulses using the apparatus according to the present invention. Such apparatus comprises the DDS which is configured as noted above.

First, 10×PLL multiplier 101 within DDS 100 receives 19.6608 MHz system reference clock pulses, converts the system reference clock pulses into 196.608 MHz DDS operation clock signals and output the DDS operation clock signals to phase accumulator 102, phase-to-magnitude converter 103 and DA converter 104, respectively.

Subsequently, phase accumulator 102 operates using the DDS operation clock signals from 10×PLL multiplier 101 and receives a FTW in a binary format. It then accumulates a phase by the FTW to output the phase of a particular desired frequency to phase-to-magnitude converter 103.

Then, phase-to-magnitude converter 103 operates using the DDS operation clock signals from the 10×PLL multiplier 101, receives the accumulated phase of the particular frequency from phase accumulator 102, converts the phase value into a corresponding magnitude of a sinusoidal wave of the particular frequency, and outputs the sinusoidal signal to DA converter 104.

Thereafter, DA converter 104 operates using the DDS operation clock signals from the 10×PLL multiplier 101. It then receives the sinusoidal signal, which has the magnitude associated with the phase value of phase accumulator 102, from the phase-magnitude converter 103, converts the signal to an analog signal, and output the analog signal of a DDS output frequency to band pass filter 200.

By way of an example, a method for deriving the output frequency of DDS 100 and the FTW is illustrated below.

If it is assumed that the DDS operation clock frequency is 196.608 MHz, the output frequency is 58.9824 MHz and the number N of input bits of phase accumulator 102 is 48, then it becomes 58.9824 MHz=FTW*196.608 MHz/$2^{48}$ when applying the above equation (1). Therefore, the FTW is (58.9824 MHz*$2^{48}$)/196.608 MHz. By equation (2), the FTW becomes 4CCCCCCCCCCD in hexadecimal, or 010011001100110011001100110011001100110011001101 in binary.

Through the above calculation, the FTW can be obtained. By controlling the value of the FTW, it is possible to change the output frequency of DDS 100.

Subsequently, band pass filter 200 receives the analog signal of the DDS output frequency from the DA converter 104, passes the signal only over a desired band of the DDS output frequency to comparator 300 to produce a clean sinusoidal waveform by removing unnecessary spurious signals, harmonics signals, etc. included in the DDS output frequency signal, and output the signal to comparator 300.

Then, comparator 300 receives the signal over the desired band of the DDS output frequency from band pass filter 200, transforms the signal of the DDS output frequency into a square wave, where jitter and phase noise are removed by using a precise zero-crossing threshold.

The above apparatus for generating clock pulses using DDS 100 can produce $2^N-1$ different frequencies signals ranging from 0 to half of the operation frequency with an increment of $½^N$, where N is the number of the input bits of phase accumulator 102.

INDUSTRIAL APPLICABILITY

As described above, according to the present invention, a particular desired frequency may be produced by changing the FTW when generating the clock pulses using the DDS. This is so that the output frequency can be changed more flexibly than the conventional clock generator using a PLL. Further, better stable system clock pulses can be supplied by removing jitter, phase noise, etc.

While the present invention has been shown and described with respect to a preferred embodiment, those skilled in the art will recognize that various changes and modifications may be made without departing from the scope of the invention as defined in the appended claims.

The invention claimed is:

1. An apparatus comprising:
a Direct Digital Synthesizer (DDS) comprising:
a Phase Locked Loop (PLL) multiplier configured to convert a system reference clock signal of a system reference clock frequency into DDS operation clock signal of a DDS operation clock frequency;
a phase accumulator configured to operate using the DDS operation clock signal, accumulate a phase using a Frequency Tuning Word (FTW), and output an accumulated phase of a particular frequency;
a phase-to-magnitude converter configured to operate using the DDS operation clock signal and generate a sinusoidal signal of the particular frequency having a magnitude corresponding to the accumulated phase of the particular frequency; and
a Digital-to-Analog (DA) converter configured to operate using the DDS operation click signal from the PLL multipler and convert the sinusoidal signal of the particular frequency to an analog signal of a DDS output frequency,
a band pass filter configured to pass the analog signal of the DDS output frequency from the DA converter over a particular frequency band of the DDS output frequency; and
a comparator configured to transform the passed analog the signal into a square wave signal and output the square wave signal.

2. The apparatus of claim 1, wherein the PLL multiplier is a 10× PLL multiplier.

3. The apparatus of claim 1, wherein the FTW is derived from equations (1) and (2) below $$f_{out}=(W*f_{clk})/2^N \quad (1)$$

$$W=INT[(f_{out}/f_{clk})*2^N] \quad (2)$$

where $f_{out}$ is the DDS output frequency, W is a binary value for the FTW, $f_{clk}$ is the DDS operation clock frequency, N is the number of input bits of the phase accumulator, and INT[ ] denotes an integer part of the bracketed expression.

4. The apparatus of claim 1, wherein the square wave signal has a low jitter.

5. The apparatus of claim 1, wherein the system reference clock frequency is 19.6608 MHz and the DDS operation clock frequency is 196.608 MHz.

6. The apparatus of claim 1, wherein the bandpass filter is further configured to remove spurious signals and harmonics signals from the analog signal.

7. The apparatus of claim 1, wherein the comparator has a zero-crossing threshold.

8. The apparatus of claim 3, wherein the binary value for the FTW comprises 0100-110011001100110011001100110011001100110011001101, the number of input bits of the phase accumulator comprises 48, and the output frequency comprises 58.9824 MHz.

9. An apparatus comprising:
 means for frequency multiplying a system reference clock signal of a system reference clock frequency to generate an operation clock signal of an operation clock frequency;
 means for accumulating a phase using a Frequency Tuning Word (FTW) to provide an accumulated phase of a particular frequency, wherein the means for accumulating operates using the operation clock signal;
 means for generating a sinusoidal signal of the particular frequency having a magnitude corresponding to the accumulated phase of the particular frequency, wherein the means for generating operates using the operation clock signal;
 means for converting the sinusoidal signal of the particular frequency to an analog signal of an output frequency, wherein the means for converting operates using the operation clock signal;
 means for passing the analog signal of the output frequency over a particular frequency band of the output frequency; and
 means for transforming the passed analog signal into a square wave signal.

10. The apparatus of claim 9, wherein frequency multiplying the system reference clock signal to generate the operation clock signal comprises multiplying the system reference clock frequency by a factor of 10.

11. The apparatus of claim 9, wherein the FTW is derived from equations (1) and (2) below, $$f_{out}=(W*f_{clk})/2^N \quad (1)$$

$$W=INT[(f_{out}/f_{clk})*2^N] \quad (2)$$

where $f_{out}$ is the output frequency, W is a binary value for the FTW, $f_{clk}$ is the operation clock frequency, N is the number of input bits of the phase accumulator, and INT[] denotes an integer part of the bracketed expression.

12. The apparatus of claim 11, wherein the binary value for the FTW comprises 01001-100110011001100110011001100110011001100110011001101, the number of input bits of the phase a accumulator comprises 48, and the output frequency comprises 58.9824 MHz.

13. The apparatus of claim 9, wherein the square wave signal has a low jitter.

14. The apparatus of claim 9, wherein the system reference clock frequency is 19.6608 MHz and the operation clock frequency is 196.608 MHz.

15. A method comprising:
 frequency multiplying a system reference clock signal of a system reference clock frequency to provide an operation clock signal of an operation clock frequency;
 using the operation clock signal, accumulating a phase using a Frequency Tuning Word (FTW) to provide an accumulated phase of a particular frequency;
 using the operation clock signal, generating a sinusoidal signal of the particular frequency having a magnitude corresponding to the accumulated phase of the particular frequency;
 using the operation clock signal, converting the sinusoidal signal of the particular frequency to an analog signal of an output frequency;
 passing the analog signal of the output frequency over a particular frequency band of the output frequency; and
 transforming the passed analog signal into a square wave signal.

16. The method of claim 15, wherein frequency multiplying the system reference clock signal to generate the operation clock signal comprises multiplying the system reference clock frequency by a factor of 10.

17. The method of claim 15, wherein the FTW is derived from equations (1) and (2) below, $$f_{out}=(W*f_{clk})/2^N \quad (1)$$

$$W=INT[(f_{out}/f_{clk})*2^N] \quad (2)$$

where $f_{out}$ is the output frequency, W is a binary value for the FTW, $f_{clk}$ is the operation clock frequency, N is the number of input bits of the phase accumulator, and INT[] denotes an integer part of the bracketed expression.

18. The method of claim 15, wherein the binary value for the FTW comprises 010011001-1001100110011001100110011001100110011001101, the number of input bits of the phase accumulator comprises 48, and the output frequency comprises 58.9824 MHz.

19. The method of claim 15, wherein the square wave signal has a low jitter.

20. The method of claim 15, wherein the system reference clock frequency is 19.6608 MHz and the operation clock frequency is 196.608 MHz.

* * * * *

UNITED STATES PATENT AND TRADEMARK OFFICE
CERTIFICATE OF CORRECTION

| | | |
|---|---|---|
| PATENT NO. | : 7,912,882 B2 | Page 1 of 1 |
| APPLICATION NO. | : 10/561558 | |
| DATED | : March 22, 2011 | |
| INVENTOR(S) | : Kim | |

It is certified that error appears in the above-identified patent and that said Letters Patent is hereby corrected as shown below:

Column 4, line 45, in Claim 1, delete "into DDS" and insert -- into a DDS --.

Column 4, line 57, in Claim 1, delete "click" and insert -- clock --.

Column 4, line 58, in Claim 1, delete "multipler" and insert -- multiplier --.

Column 4, line 60, in Claim 1, delete "frequency," and insert -- frequency; --.

Column 4, line 65, in Claim 1, delete "analog the" and insert -- analog --.

Column 5, line 2, in Claim 2, delete "10× PLL" and insert -- 10×PLL --.

Column 5, line 4, in Claim 3, delete "below" and insert -- below, --.

Column 5, line 18, in Claim 6, delete "bandpass" and insert -- band pass --.

Column 6, line 8, in Claim 12, delete "phase a" and insert -- phase --.

Signed and Sealed this
Sixteenth Day of August, 2011

David J. Kappos
*Director of the United States Patent and Trademark Office*